United States Patent
Pavlenko et al.

(10) Patent No.: US 6,548,752 B2
(45) Date of Patent: Apr. 15, 2003

(54) SYSTEM AND METHOD FOR GENERATING A TORSION FIELD

(75) Inventors: Anatoliy R. Pavlenko, Kiev (UA); Olexander A. Pavlenko, Kiev (UA)

(73) Assignee: Alpha-E, L.L.C., Deerfield, IL (US)

( * ) Notice: Subject to any disclaimer, the term of this patent is extended or adjusted under 35 U.S.C. 154(b) by 0 days.

(21) Appl. No.: 09/992,835

(22) Filed: Nov. 16, 2001

(65) Prior Publication Data

US 2002/0153150 A1 Oct. 24, 2002

Related U.S. Application Data

(60) Provisional application No. 60/249,178, filed on Nov. 16, 2000.

(51) Int. Cl.[7] .................................................. H05K 9/00
(52) U.S. Cl. .................................. 174/35 R; 250/505.1; 250/423 R
(58) Field of Search .................... 174/35 R; 361/816, 361/818, 800; 250/423 R, 505.1

(56) References Cited

FOREIGN PATENT DOCUMENTS

| FR | 2683380 | * | 5/1993 |
| RU | 2147962 C1 | * | 9/1998 |
| WO | WO 00/73649 | * | 11/2000 |

* cited by examiner

*Primary Examiner*—Hung V. Ngo
(74) *Attorney, Agent, or Firm*—Sonnenschein, Nath & Rosenthal

(57) ABSTRACT

A device for generating a torsion field having a salt solution disposed in a first chamber, a torsion field generator for producing a right torsion field, and a magnetic element. The magnetic element rotates in response to a change in magnetic polarity. The torsion field generator is operably associated with the magnetic element. As a result, the torsion field generator is oriented in a predetermined association with respect to the earth's magnetic field. The first chamber and the torsion field generator are disposed such that a portion of the right torsion field propagates through the salt solution.

20 Claims, 8 Drawing Sheets

SYSTEM AND METHOD FOR GENERATING A TORSION FIELD

RELATED APPLICATIONS

This application claims priority from and incorporates by reference the provisional patent application Ser. No. 60/249,178 filed on Nov. 16, 2000 entitled "System and Method of Generating a Torsion Field."

FIELD OF THE INVENTION

This invention relates to torsion fields, an in particular to a device for providing protection from torsion fields for users of electronic equipment.

BACKGROUND OF THE INVENTION

Torsion fields are generated by the classical spin, or by the spin angular momentum density (on a macroscopic level) of any object. The spinning of an object sets up polarization in two spatial cones, corresponding to a left torsion field and a right torsion field. At an atomic level, nuclear spin as well as full atomic movements may be the source of torsion fields. This means that all objects in nature, live or dead, generate their own torsion field.

Unlike electromagnetic and gravitation fields that have central symmetry, torsion fields have axial symmetry. Torsion fields are also different from electromagnetic fields in that torsion fields having an opposite spin repel each other. Torsion fields may also propagate through physical media without interacting with the media. Thus, torsion fields may not be shielded by most materials. However, a propagating torsion field alters the spin state of the media it propagates through.

Since all substances have their own stereochemistry which determines not only the location of atoms in molecules, but also determines their mutual spin orientation, then the superposition of the torsion fields generated by the atomic and nuclear spins of each molecule determines the intensity of the torsion field in the space surrounding each molecule. The superposition of all these torsion fields determines the intensity and spatial configuration of the characteristic torsion field for that substance. Thus, each physical object, whether living or non-living, possesses its own characteristic torsion field.

Torsion fields may also be generated by other methods in addition to the classical spin of particles. A wide spectrum of geometric forms of substances and objects are a natural source of torsion fields. Objects with a certain surface geometry will simultaneously generate left and right torsion fields of a certain configuration depending on the geometry of the object. Examples include, pyramids, cones, tridents, cylinders, and flat triangles.

Torsion fields are also generated by electromagnetic fields. Since charge polarization simultaneously results in a loss of equilibrium in charge and spin, an electrostatic field is also followed by a torsion field. Thus, sources of electromagnetic and electrostatic fields are always sources of torsion fields.

As electromagnetic fields are accompanied by torsion fields, most electronic devices, such as mobile phones, computer monitors and televisions are sources of torsion fields. Mobile phones, as most other electronic devices generate a left torsion field and a right torsion field.

The property of spin of the molecules in each object is subject to influence by external torsion fields. Thus, the structure of the torsion field of each physical object can be altered by the influence of an external torsion field. The influence of an external torsion field would result in a new configuration of the torsion field in the object. This new torsion field would be fixed as a metastable state and will remain intact even after the source of the external torsion field is removed.

Experiments have shown that exposure to left torsion fields may have a negative effect on the human body, while right torsion fields may actually have a positive effect. The negative effects of left torsion fields may include a decline in the response of the immune system and a susceptibility to disease.

SUMMARY OF THE INVENTION

The present invention relates to a device for generating a torsion. The device includes a salt solution, a torsion field generator, and a magnetic element. The first chamber and the torsion field generator being disposed such that a portion of the right torsion field propagates through the salt solution.

In one embodiment, the first chamber may be in the shape of a sphere. The magnetic element may also be a sphere and disposed within the first chamber. The salt solution may be disposed between the first chamber and the magnetic element or alternatively, within the magnetic element.

The magnetic element may be operably associated with the torsion field generator so that the magnetic element rotates in response to a change in magnetic polarity. The magnetic element orients the torsion field generator in a predetermined association with respect to the earth's magnetic field. The magnetic element may align the torsion field generator with the earth's magnetic field. In one embodiment, the torsion field generator may be aligned so that the torsion field generator is on the south side of the first chamber and produces a torsion field that propagates towards the north pole.

The torsion field generator may be in the shape of a trident. The torsion field generator inherently produces the right torsion field. The torsion field generator may also inherently produces a left torsion field.

The salt solution may include a rare earth metal salt. In one embodiment, the salt solution may include approximately 5% Cerium, 5% Lutetium, and 5% Erbium by composition.

The present invention may further include a second chamber in proximity to the first chamber. A carbon solution may be disposed in the second chamber. In one embodiment, the carbon solution has approximately 10–12% Carbon by composition. The carbon solution may inherently reduce proximate electromagnetic fields, which may also inherently decrease proximate torsion fields.

In accordance with another aspect of this invention a method of significantly decreasing the presence of left torsion fields about an electronic device comprises orienting a torsion field generator in a predetermined association with respect to the magnetic field of the earth; generating a torsion field; and propagating the torsion field through a salt solution. The method may further include generating a first right torsion field; attracting a second right torsion field from the electronic device; generating a first left torsion field; and attracting a second left torsion field from the electronic device.

DETAILED DESCRIPTION

Figure 1A:
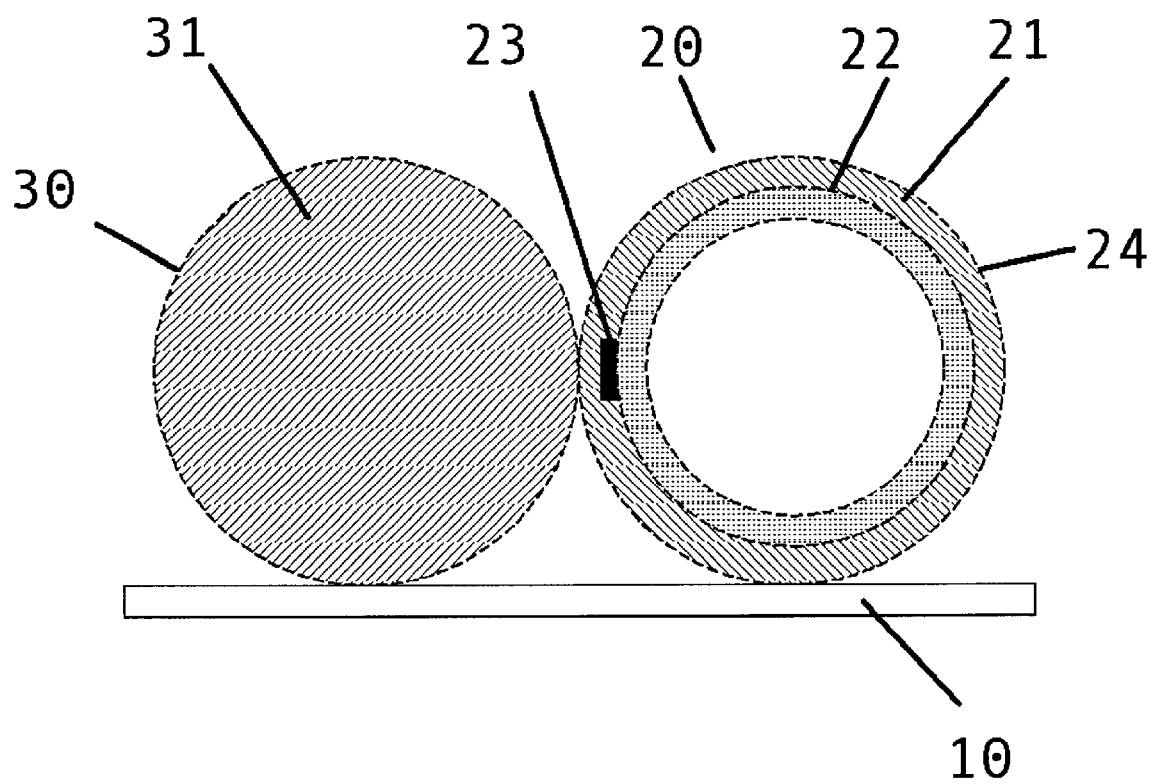
FIGS. 1$a$ and 1$b$ are side and top cross-sectional view of one embodiment of the present invention.

While the present invention may be embodied in many different forms, there is shown in the drawings and discussed herein a few specific embodiments with the understanding that the present disclosure is to be considered only as an exemplification of the principles of the invention and is not intended to limit the invention to the embodiments illustrated.

Figure 1B:
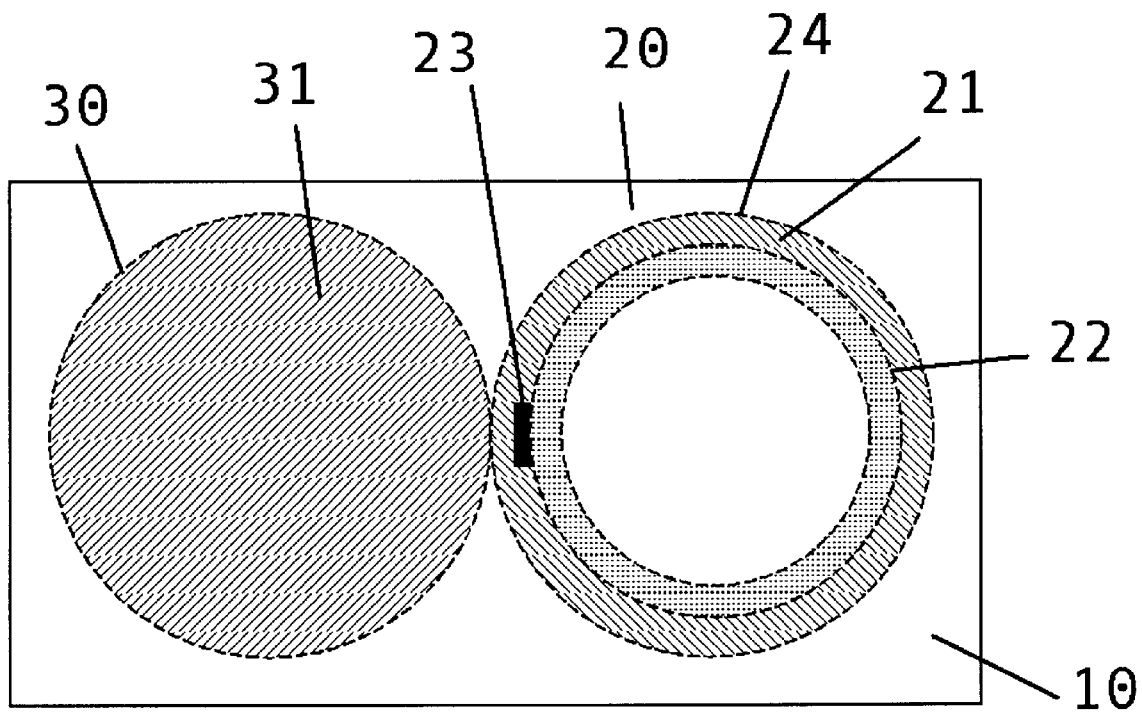

FIGS. 1a and 1b depict one potential embodiment of a device for generating a torsion field to provide significant protection to a user from left torsion fields, especially those generated by electronic equipment. The device may include a first chamber 20 and a second chamber 30. In one embodiment, the first chamber 20 and the second chamber 30 are positioned on a base 10 adjacent to each other. The base 10 allows for the device to be mounted onto a surface of electronic equipment, such as a mobile phone.

In one embodiment of the invention, the first chamber 20 may be spherical in shape and may be constructed out of a non-magnetic glass-type material. However, the first chamber may be any shape and may be constructed out of another material as long as the material does not interfere with the functionality of the device.

The first chamber may include a salt solution 21, a magnetic element 22, and a torsion field generator 23. The salt solution may include water plus any element that would provide a significant number of positive and negative ions in the solution. For example, the salt solution may be natural sea water. The salt solution may alternatively be comprised of water and ordinary table salt. The use of various elements, as well as various combinations of elements will result in varying torsion field strengths generated by the present device. Along with the choice of elements, the strength of the generated torsion field is also affected by the concentration of each element in the solution, the hydration of each element, the temperature of the solution, and the total volume of the solution. The water in the salt solution may also be substituted with other liquids so long as the liquid is capable of generating torsion fields.

In one embodiment, the salt solution includes a rare earth metal salt. The rare earth metal salt may be any element with an atomic numbers from 58 to 71 (inclusive) on the periodic chart. By using a salt solution including rare earth metals, the strength of the torsion field generated by the present invention is increased in comparison to any other type of salt solution. In one approach, the salt solution includes three different elements. The salt solution may be approximately 5% Cerium, 5% Lutetium, and 5% Erbium by composition. However, any other rare earth metal salt may be used in addition to or in place of the these elements. The concentration of the element may also be varied.

The salt solution generates left and right torsion due to the movement of opposite ions in opposite directions. The ions are set into motion by the magnetic fields generated by the magnetic poles of the earth. Hydroxyl ions and hydroxonium ions that are inherently present in the solution are set into motion as a result of the magnetic fields. The trajectories of movement of the hydroxyl and hydroxonium ions are cycloids.

Since water molecules have a high dipole moment, the hydroxyl and hydroxonium ions that move from the point where they have appeared during dimer decomposition and rotate in the same area but in opposite directions will orient the nearest water molecules as if stringing them on the arch of a cycloid. This results in the unification of molecules situated on the hydroxile and hydroxone arches into flat circular associates due to collective aquatic links. Circular associates that appear are extremely passive because they are unpolar, neutral and slow moving due to their large size and weight. This makes the reconstruction of water into regulated ice-like structures easier. The ice-like structures generate the left and right torsion fields.

Magnetic element 22 is designed to rotate in response to a change in magnetic polarity such that the torsion field generator is oriented in a predetermined association with the earth's magnetic field. Thus, the magnetic element may basically act as a magnetic compass such that a predetermined portion of the magnetic element always faces in a predetermined direction, such as north. In one embodiment, the magnetic element is spherical and situated within and substantially concentric with the first chamber 20. The salt solution may be disposed between the magnetic element and the first chamber. As such, the magnetic element is suspended in the solution, allowing the magnetic element to rotate without a significant amount of friction. The salt solution may also be disposed within the magnetic element or the salt solution may be disposed both inside and outside of the magnetic element. In yet another approach, the salt solution may also be disposed in only a portion of the first chamber a long as a portion of the right torsion field produced by the torsion field generator propagates through the salt solution. If the salt solution is only inside the magnetic element or in only a portion of the first chamber, a different liquid or lubricant may be used between the magnetic element and the first chamber in order to allow the magnetic element to rotate without significant friction.

In one embodiment, the magnetic element 22 may include a first magnetic portion and a second magnetic portion associated with a susbtantially non-magnetic sphere. The magnetic portions may be metallic and the non-magnetic portion may be constructed from a plastic material. The first and second magnetic portions have opposite polarity and are preferably located on opposite sides of the spherical magnetic element. Thus, the first magnetic portion may have a positive polarity and the second magnetic portion may have a negative polarity. The first magnetic portion is then attracted to the south pole and the second magnetic portion is attracted to the north pole. This attraction rotates the magnetic element such that the magnetic portions become aligned with the earth's magnetic fields. Alternatively, the magnetic element may also be entirely metallic, a magnetized ferrous material, or any other material so long as the magnetic element is capable of continuously orienting a predetermined portion of the magnetic element in a predetermined direction in a association with the earths's magnetic field. The design and shape of the magnetic element may also be any other method as is known in the prior art for the construction of magnetic compasses.

Torsion field generator 23 may be any geometric shape capable of inherently producing left and right torsion fields.

Figure 2A:
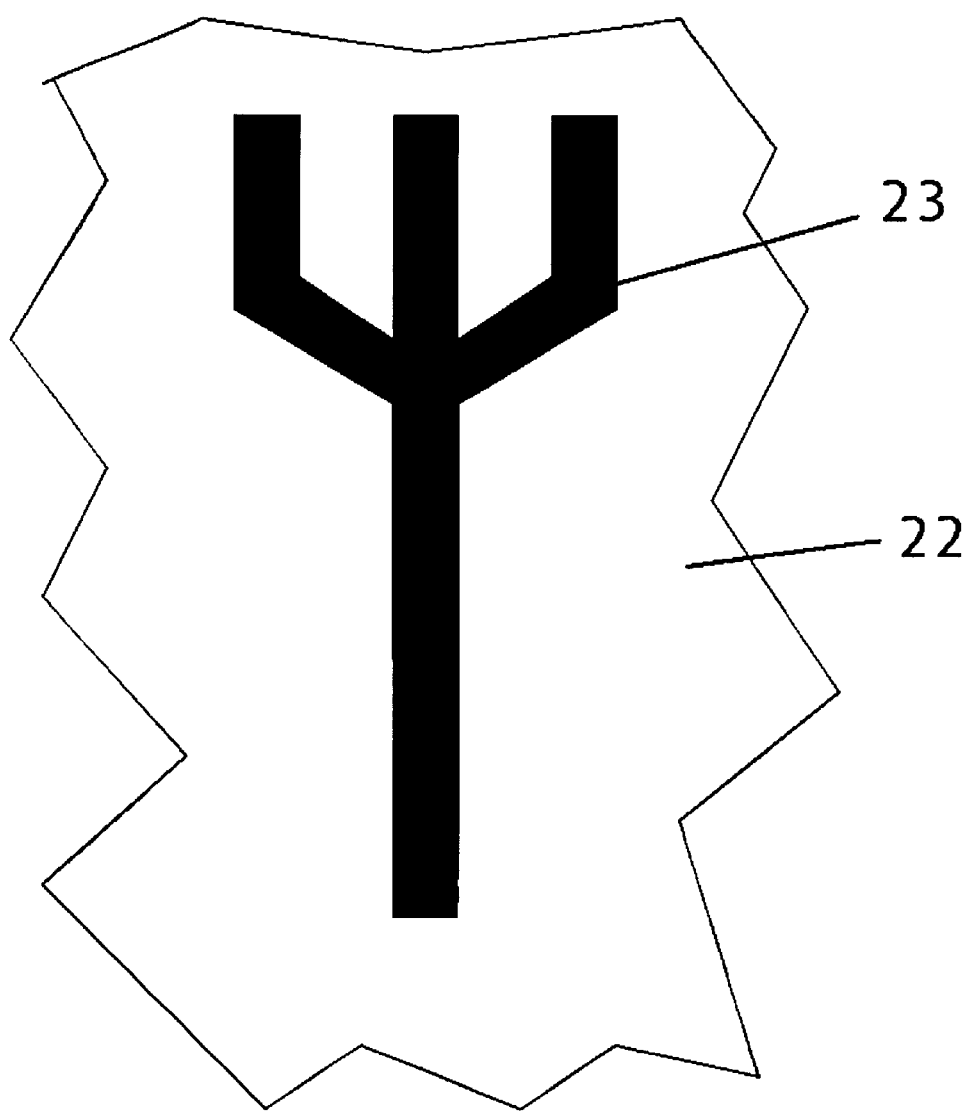
FIGS. 2a and 2b are two embodiments of the torsion generator in the present invention.
Figure 2B:
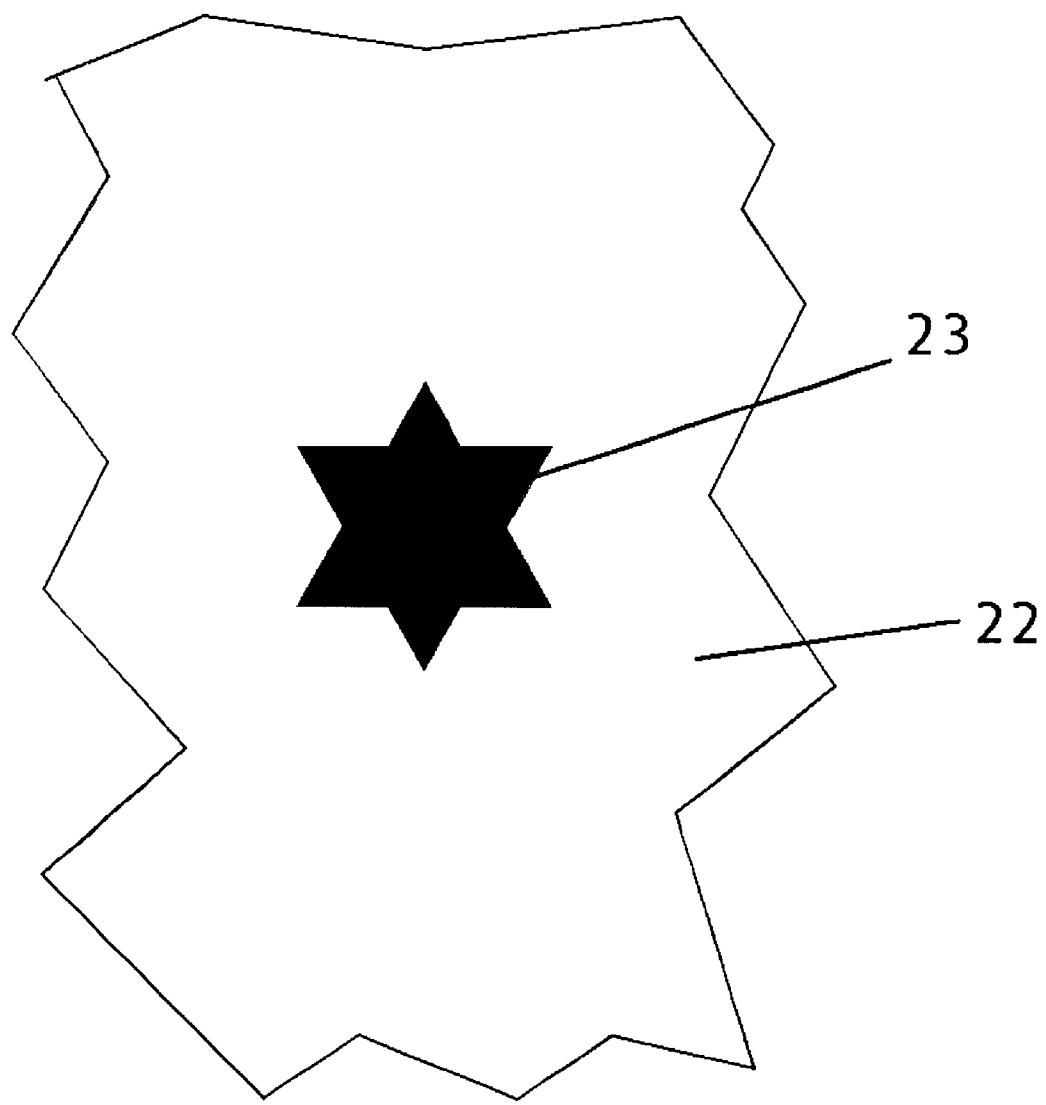

In one embodiment, the torsion field generator is in the shape of a trident (see FIG. 2a) and is metallic. Alternatively, the torsion field generator may be in the shape of the star of David (see FIG. 2b). However, the torsion field generator may also be in the form of pins, diffraction grid elements, or any geometric shape capable of inherently producing a torsion field. The torsion field generator may also be constructed from any material capable of inherently producing torsion fields.

The torsion field generator 23 is operably associated with the magnetic element 22. In one embodiment, the torsion field generator is attached to the outer wall of the magnetic element 22. However, the torsion field generator 23 may alternatively be attached to the inner wall of the magnetic element 22, or within the magnetic element 22. As a result of being associated with the magnetic element, the torsion field generator 23 is also rotated with respect to the first chamber 20. Thus, the magnetic element 22 basically serves to continually position the torsion field generator 23 in a similar orientation with respect to the magnetic fields of the earth regardless of the orientation of the first chamber 20.

In one approach, the torsion field generator 23 is positioned on the magnetic element such that the torsion field generator 23 will be situated on the portion of the magnetic element 22 that faces substantially south. The torsion field generator produces a right torsion field and a left torsion field due to the topology of the torsion field generator. By orienting the torsion field generator in a substantially southern direction, the torsion fields produced by the torsion field generator are aligned with the magnetic fields of the earth, thereby increasing the right and left torsion fields produced by the torsion field generator. The torsion generator may alternatively be positioned on the magnetic element such that the torsion field generator 23 will be situated on the portion of the magnetic element 22 that faces substantially north. This would also serve to align the torsion fields produced by the torsion field generator with the magnetic fields of the earth.

Figure 3:
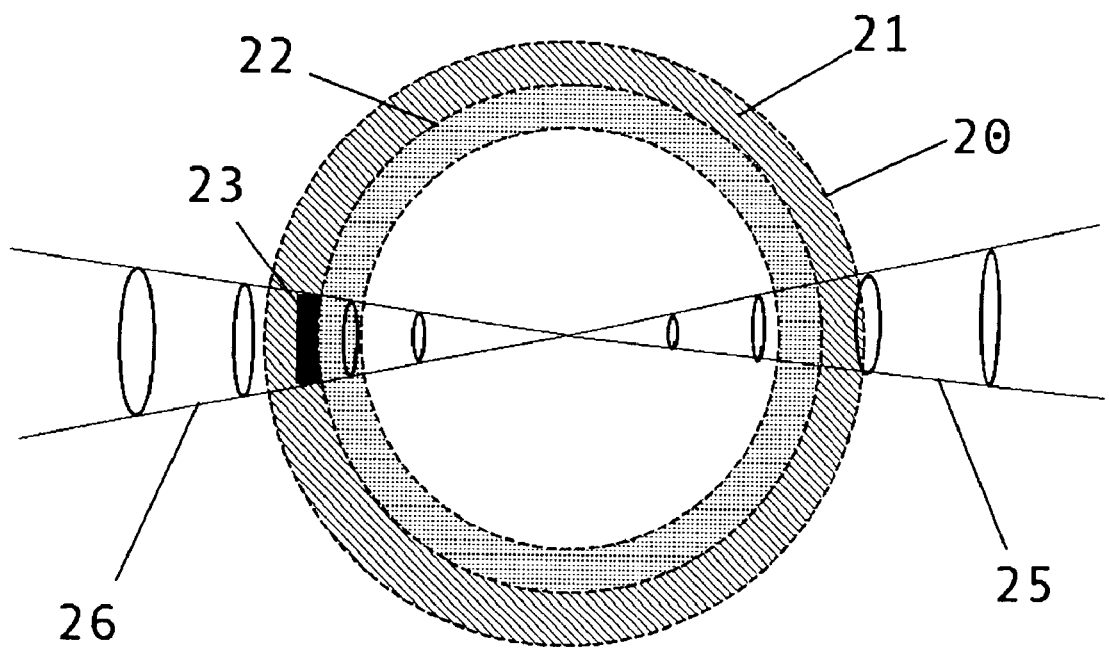
FIG. 3 is a schematic view of the torsion fields generated by the first sphere.

As the salt solution is disposed around the magnetic element, the torsion fields produced by the torsion field generator also propagate through the salt solution, further increasing both the right and left torsion fields generated by the present invention. As shown in FIG. 3, the combination of the salt solution and the torsion generator produce a right torsion field 25 and a left torsion field 26. When the torsion field generator is positioned towards the south, the right torsion field 25 propagates in a substantially northward direction, and the left torsion field 26 propagates in a substantially southward direction.

The second chamber 30 may also be spherical in shape and constructed out of a non-magnetic glass type material. In one embodiment, the second chamber 30 is adjacent to the first sphere chamber 20. The second chamber includes a carbon solution 31. In one approach, the carbon solution is water with approximately 10%–12% carbon by composition. However, the concentration of carbon in the carbon solution may be altered.

Colloid solution of carbon may partially absorb electromagnetic radiation. This is due to the concentration of the total weight and free energy of the system in the interphase surface layers. Thus, the carbon solution in the second chamber may absorb, and therefore reduce, a portion of an electromagnetic field generated by an associated electronic device. Since electromagnetic fields are a significant source of torsion fields, the reduction of the electromagnetic field produced by electronic equipment has the benefit of also decreasing the overall torsion fields generated by the electronic equipment. Although the second chamber may aid in reducing the torsion fields and the electromagnetic fields surrounding most electronic equipment, the torsion fields generated by the first chamber may be sufficient to protect the user from the left torsion fields generated by such electronic equipment independent of the carbon solution.

Figure 4A:
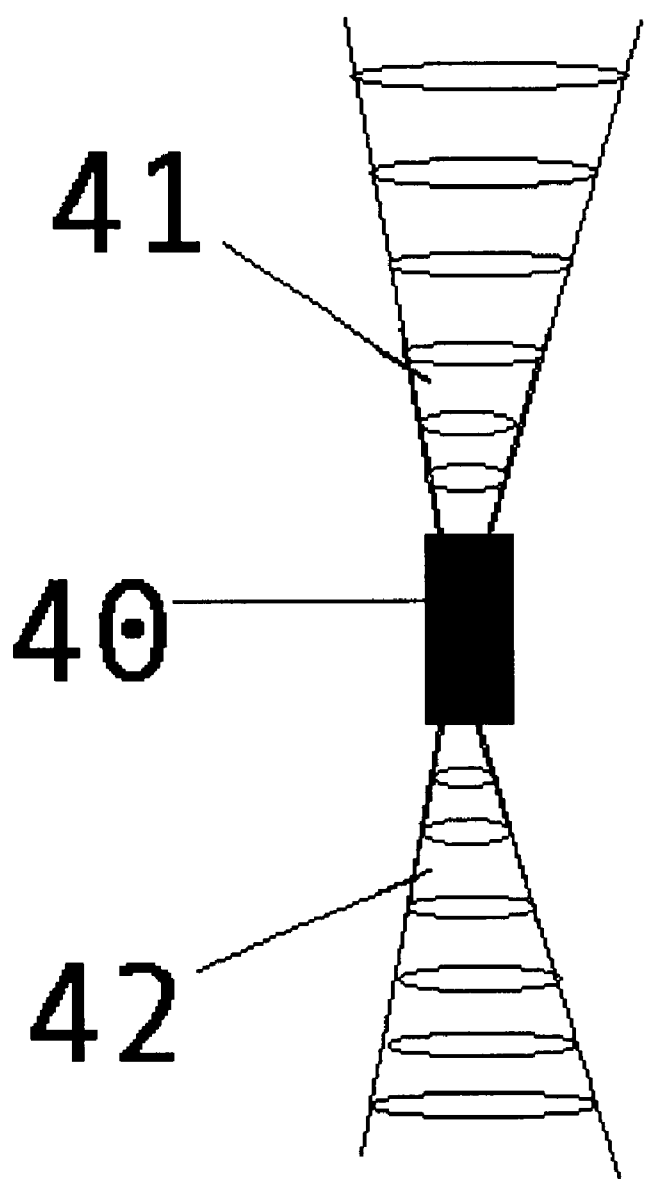
FIGS. 4a and 4b and 4c are comparison views of the torsion fields generated by an electronic device, the interactions between the torsion fields generated by one embodiment of the first chamber and the torsion fields generated by an electronic device, and the interactions between the torsion fields generated by one embodiment of present invention and the torsion fields generated by an electronic device, respectively.

In operation, the present invention may be mounted on, placed inside of, or placed in proximity to an electronic device such as a mobile phone. As shown in FIG. 4a, the electronic device 40, such as a mobile phone, generates a left torsion field 42 and right torsion field 41, as well as electromagnetic fields (not shown). Typically, these torsion fields propagate over great distances without attenuation and may have a negative effect the user of the electronic device.

Figure 4B:
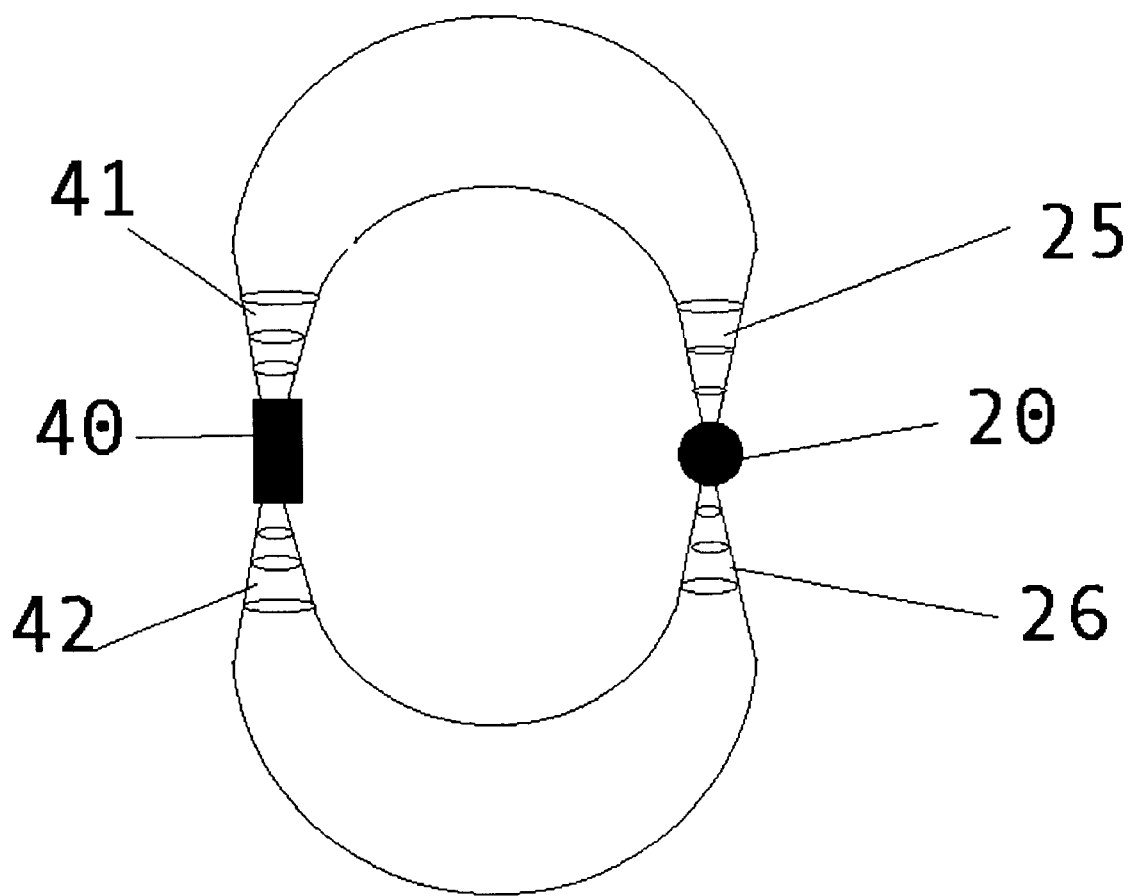

As illustrated in FIG. 4b, the left torsion field 26 and right torsion field 25 generated from the first chamber 20 interact with the left torsion field 42 and the right torsion field 41 that are generated by the electronic device 40. Specifically, the right torsion field 25 generated from the first chamber 20 attracts the right torsion field 41 generated by the electronic device 40 and the left torsion field 26 generated from the first chamber 20 attracts the left torsion field 42 generated by the electronic device 40. This attraction between torsion fields forms the torsion fields into a loop that has the effect of substantially preventing the torsion fields generated by either the present invention or the electronic device from propagating in any direction except towards one another. Thus, the attraction between the torsion fields creates a boundary beyond which the torsion fields may not propagate.

When the present invention is placed inside the mobile phone or other electronic device, the distance between the torsion field of the present invention and the torsion fields of the electronic device is small, increasing the attraction between them. As a result, the are of the loop formed by the attracting torsion fields is small and substantially contained within the inside of the electronic device. Therefore, the torsion fields are substantially prevented from propagating out of the electronic device, decreasing the effects of the torsion fields on the user.

Figure 4C:
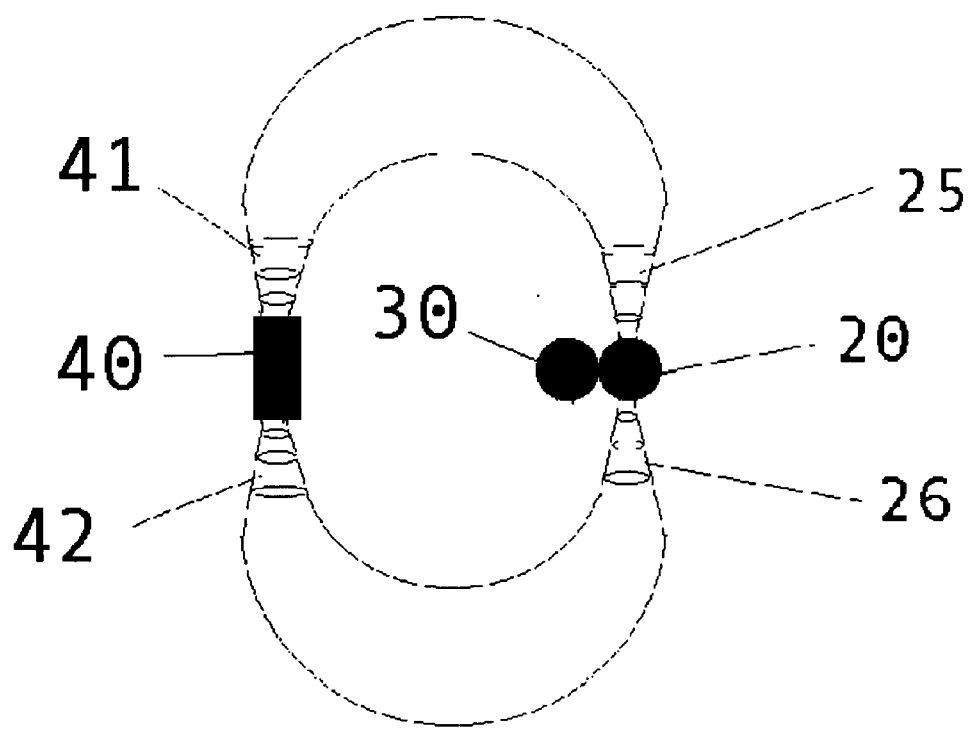

Additionally, as illustrated in FIG. 4c, the carbon solution in the second chamber 30 may further reduce the overall strength of the electromagnetic fields, and therefore, also the overall strength of the left torsion fields generated by the mobile phone. This further reduces the area affected by the torsion fields.

The present invention may be also be used to decrease the effects from torsion fields generated by other electrical equipment, including vehicles, stereos, televisions, etc. For each electronic device, the concentrations of elements in the salt solution, as well as the type of right torsion field generator may be altered in order to achieve the appropriate torsion field for the associated electronic device.

We claim:

1. A device for generating a torsion field comprising:
   a salt solution disposed in a first chamber;
   a torsion field generator for producing a right torsion field; and
   a magnetic element operably associated with the torsion field generator, wherein the magnetic element rotates in response to a change in magnetic polarity such that the torsion field generator is oriented in a predetermined association with respect to the earth's magnetic field,
   the first chamber and the torsion field generator being disposed such that a portion of the right torsion field propagates through the salt solution.

2. The device of claim 1 wherein the magnetic element rotates in response to a change in magnetic polarity to orient the torsion field generator such that the right torsion field is aligned with the earth's magnetic field.

3. The device of claim 2 wherein the magnetic element rotates in response to a change in magnetic polarity to orient the torsion field generator such that the right torsion field propagates towards the north pole.

4. The device of claim 3 wherein the predetermined direction is south.

5. The device of claim 1 wherein the magnetic element is within the first chamber.

6. The device of claim 5 wherein the first chamber is in the shape of a sphere; and the magnetic element is in the shape of a sphere; and the first chamber and the magnetic element are concentric.

7. The device of claim 6 wherein the salt solution is disposed between the magnetic element and the first chamber.

8. The device of claim 7 wherein the salt solution is within the magnetic element.

9. The device of claim 1 wherein the torsion field generator inherently produces the right torsion field.

10. The device of claim 9 wherein the torsion field generator inherently produces a left torsion field.

11. The device of claim 10 wherein the torsion field generator is in the shape of a trident.

12. The device of claim 1 wherein the salt solution includes a rare earth metal salt.

13. The device of claim 12 wherein the salt solution includes approximately 5% Cerium, 5% Lutetium, and 5% Erbium by composition.

14. The device of claim 1 further including a second chamber in proximity to the first chamber; and a carbon solution disposed in the second chamber.

15. The device of claim 14 wherein the carbon solution has approximately 10–12% Carbon by composition.

16. The device of claim 15 wherein the carbon solution inherently reduces proximate electromagnetic fields.

17. The device of claim 16 wherein the carbon solution inherently decreases proximate torsion fields.

18. The device of claim 15 wherein the first chamber is adjacent to the second chamber.

19. A method of significantly decreasing the presence of left torsion fields about an electronic device comprising:

orienting a torsion field generator in a predetermined association with respect to the magnetic field of the earth;

generating a torsion field; and propagating the torsion field through a salt solution.

20. The method of claim 19 further including:

generating a first right torsion field;

attracting a second right torsion field from the electronic device;

generating a first left torsion field; and attracting a second left torsion field from the electronic device.

* * * * *